United States Patent [19]
Moore et al.

[11] Patent Number: 6,081,110
[45] Date of Patent: Jun. 27, 2000

[54] THERMAL ISOLATION PLATE FOR PROBE CARD

[75] Inventors: James David Moore, Tualatin; James M. Hannan; Jeffrey S. McMullin, both of Portland, all of Oreg.

[73] Assignee: Credence Systems Corporation, Fremont, Calif.

[21] Appl. No.: 09/164,444

[22] Filed: Sep. 30, 1998

[51] Int. Cl.⁷ ............................. G01R 31/02; G01R 1/04
[52] U.S. Cl. ..................... 324/158.1; 324/754; 29/829
[58] Field of Search ........................... 324/754, 158.1; 29/829, 846

[56] References Cited

U.S. PATENT DOCUMENTS

| | | | |
|---|---|---|---|
| 3,866,119 | 2/1975 | Ardezzone et al. | 324/754 |
| 4,721,831 | 1/1988 | Vora | 29/829 X |
| 4,812,740 | 3/1989 | Shutts | 324/158.1 X |
| 4,963,225 | 10/1990 | Lehman-Lamer | 324/754 X |
| 5,623,214 | 4/1997 | Pasiecznik, Jr. | 324/754 |
| 5,642,054 | 6/1997 | Pasiecznik, Jr. | 324/754 |

Primary Examiner—Glenn W. Brown
Attorney, Agent, or Firm—John Smith-Hill; Smith-Hill and Bedell

[57] ABSTRACT

A thermal isolation plate for a probe card comprises a stiff, generally annular plate made of a metal having good thermal conductivity. One surface of the plate has a low emissivity and the opposite surface has a low absorptivity. Preferably the surface of low absorptivity is a highly polished surface.

18 Claims, 3 Drawing Sheets

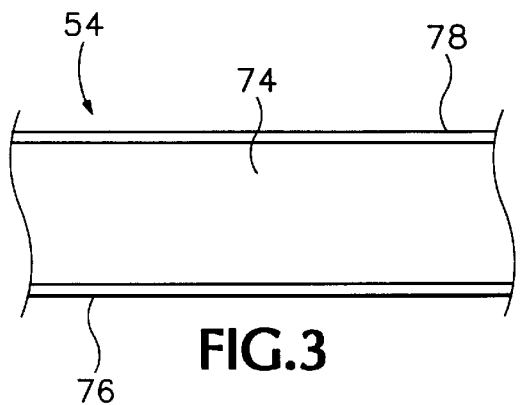
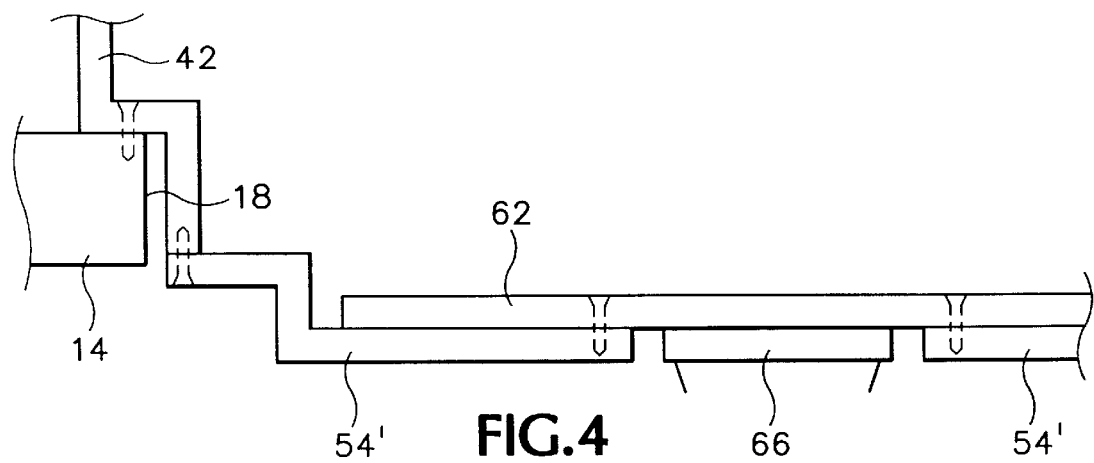

THERMAL ISOLATION PLATE FOR PROBE CARD

BACKGROUND OF THE INVENTION

This invention relates to a thermal isolation plate for a probe card.

A semiconductor tester may be used in conjunction with other equipment for testing semiconductor integrated circuit (IC) devices at various stages of manufacture.

A known form of semiconductor tester includes a test head provided with a docking plate. Pin cards are mounted in the test head and pogo pins attached to the pin cards project through the docking plate. In use of the tester, a load board (otherwise known as a DUT board) specific to the type of device to be tested is positioned relative to the docking plate so that the pogo pins of the pin cards engage contact pads on the load board. At the opposite face, the load board is provided with contact elements for electrically interfacing to the device under test (DUT).

A semiconductor tester of this kind may be used in conjunction with a wafer prober for testing devices in the wafer stage, i.e. before dicing and packaging.

One form of wafer prober includes a horizontal prober head stage formed with an aperture, a receptacle for receiving a cassette containing multiple wafers, a chuck positioned below the prober head stage for receiving a wafer, a translation mechanism for translating the chuck between a loading location adjacent the cassette receptacle and a probing location in which the chuck is beneath the aperture in the prober head stage, and a robot for transferring wafers between the cassette and the chuck.

A ring insert is fitted in the aperture in the prober head stage and is attached to the head stage. A load board, which is frequently referred to as a probe card in the context of a wafer prober, is fitted in the ring insert. The probe card may be locked at its periphery to the interior of the ring insert. The contact elements of the probe card are probe needles which project downwardly from the probe card. The ring insert has docking structures for engaging the docking plate of the test head. The test head is positioned above the ring insert and is docked thereto and the pogo pins engage the contact pads at the upper surface of the probe card. By repeatedly raising the chuck so that the probe needles engage the contact pads of an individual die, lowering the chuck, displacing the chuck to position a different die beneath the probe needles and raising the chuck, the different devices embodied in the wafer can be presented sequentially to the probe needles for testing.

When this type of wafer prober is used to test wafers embodying a different type of integrated circuit device, the test head is undocked from the ring insert, the probe card is removed from the ring insert and a new probe card, specific to the new type of IC device, is installed in the ring insert.

Another type of wafer prober employs a bottom probe card changer, which avoids the need to undock the test head from the ring insert in order to change the probe card. In a prober having a bottom probe card changer, the probe card is mounted in a frame or tray which is releasably locked to the underside of the prober head stage. When it is necessary to change the probe card, the chuck is moved to a non-interfering position and the tray is released from the prober head stage and is moved within the wafer prober housing to an access port. The tray, including the probe card, may be removed from the prober via the access port and replaced with a substitute tray, containing the appropriate probe card, or the probe card can be removed from the tray and replaced with the appropriate probe card. In either event, the tray is then automatically withdrawn into the prober, placed beneath the ring insert and locked to the prober head stage.

It has hitherto been conventional to test integrated circuits at normal room temperature, typically about 18° C. However, since some integrated circuit devices operate at substantially higher temperatures (even temperatures well above 100° C.), it has been recognized that it may be desirable to test these devices at an elevated temperature. For this purpose, the chuck of the prober may include a heater for heating the wafer held by the chuck so that the test will provide a realistic indication of the behavior of the devices embodied in the wafer at an elevated temperature.

In the conventional wafer prober provided with a heated chuck, heat may be transferred from the chuck to the probe card by radiation, conduction and/or convection, elevating the temperature of the probe card. Thermally induced strain may distort the probe card to such an extent that the probe needles do not reliably engage the respective connection pads of the device under test. Consequently, the accuracy of test results is compromised. Further, the distortion of the probe card does not remain constant with time, such that it can be accommodated simply by a one-time adjustment in the position of the chuck, because as the chuck is translated to present successive devices to the probe needles, different regions of the probe card are heated and undergo thermally induced strain.

Semiconductor IC devices frequently have several hundred contact pads. This generally necessitates that a like number of pogo pins engage the probe card. Each pogo pin includes a spring, which is compressed when the test head is docked to the ring insert. The spring force exerted by a single pogo pin on the probe card is quite small, but the total force exerted by several hundred pins may be sufficient to cause undesirable flexing of the probe card.

In order to minimize flexing of the probe card, it is known to mount a steel stiffener plate in the ring insert beneath the probe card. The stiffener plate is annular and is secured at its periphery to the ring insert. The probe card is placed on top of the stiffener plate and is locked at its periphery to the interior of the ring insert. The probe needles project downward through the central aperture of the stiffener plate.

SUMMARY OF THE INVENTION

According at a first aspect of the present invention there is provided an article of manufacture comprising a stiff, generally annular plate made of a metal having good thermal conductivity and having first and second opposite surfaces, the first surface having a low emissivity and the second surface having a low absorptivity.

According to a second aspect of the present invention there is provided a ring insert assembly for interfacing a wafer prober to a test head, including a ring insert for attachment to the wafer prober and for docking to the test head, a thermal isolation plate attached to the ring insert and having a first surface oriented toward the ring insert and a second, opposite surface oriented away from the ring insert, and a probe card attached to the thermal isolation plate in confronting relationship with the first surface of the thermal isolation plate.

BRIEF DESCRIPTION OF THE DRAWINGS

For a better understanding of the invention, and to show how the same may be carried into effect, reference will now be made, by way of example, to the accompanying drawings, in which FIG. 3 is a partial sectional view of a component of the ring insert assembly, and FIG. 4 is an enlarged partial sectional view of a modification of the ring insert assembly shown in FIGS. 1 and 2.

DETAILED DESCRIPTION

Figure 1:
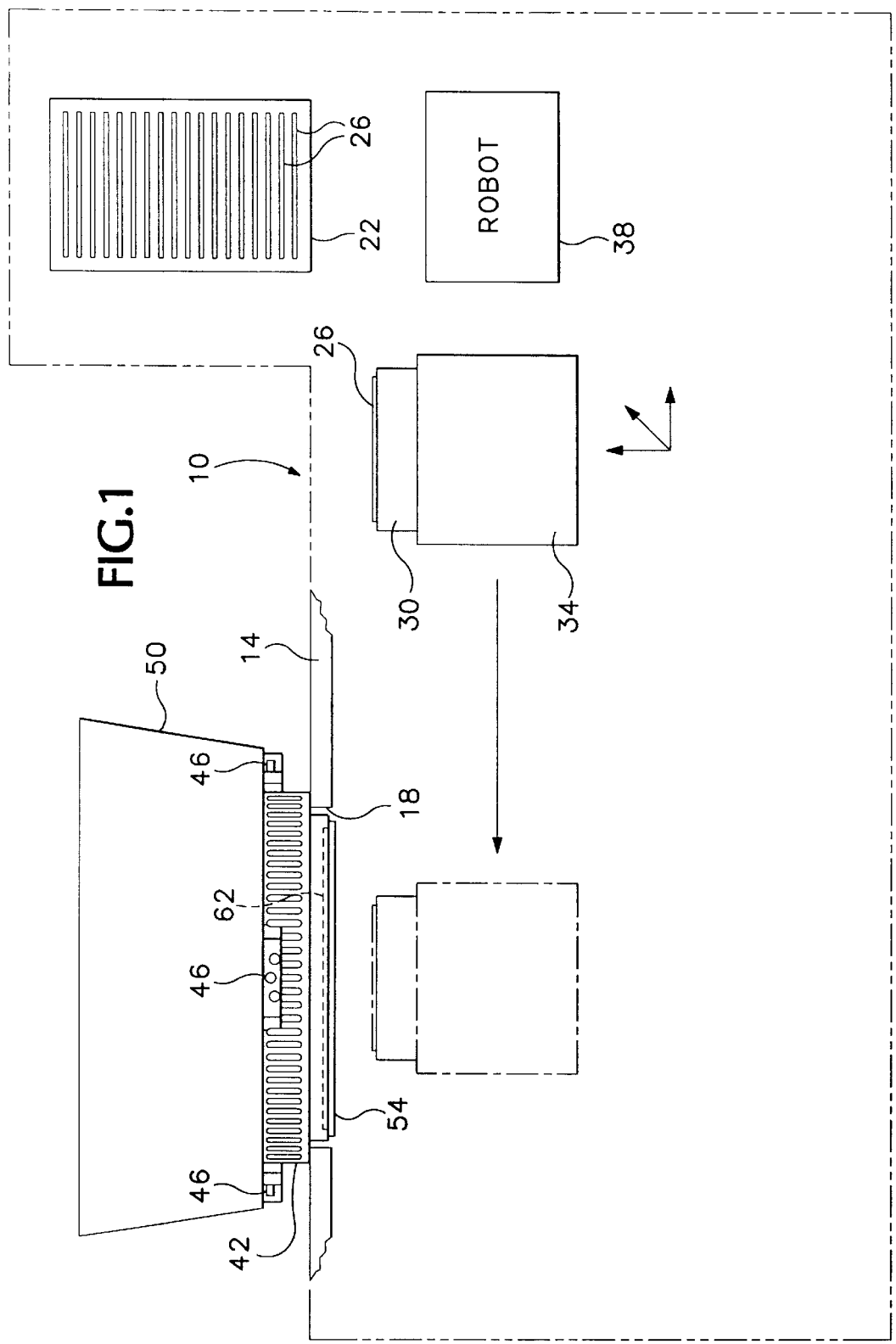
FIG. 1 is a schematic side elevation of semiconductor test equipment including a wafer prober and a ring insert assembly.

The wafer prober illustrated in FIG. 1 has a housing 10, which includes a prober head stage 14 formed with an aperture 18. The housing 10 allows access to a receptacle for receiving a cassette 22 containing multiple wafers 26, each embodying multiple integrated circuit devices to be tested. A wafer chuck 30 is mounted on a translation stage 34, which is mounted in the housing on guides (not shown) allowing movement of the translation stage in two horizontal linear degrees of freedom. The stage 34 includes a mechanism for raising and lowering the chuck 30 relative to the translation stage 34. The chuck includes a heater, such as an electrical resistance heater, for heating the chuck and thereby heating a wafer on the chuck.

A transfer mechanism 38, such as one or more robots, is used to transfer wafers between the chuck 30 and the cassette 22 when the translation stage 34 is in the position shown in solid lines in FIG. 1. In particular, assuming that a wafer that has been tested is located on the chuck 30, the transfer mechanism 38 removes the wafer from the chuck and places it in the cassette, and removes from the cassette a wafer that has not yet been tested and places it on the chuck. After the wafer has been placed on the chuck, the translation stage 34 moves to a position beneath the aperture 18.

A ring insert 42 is fitted in the aperture 18 and is secured to the prober head stage 14 by screws (not shown) fitted through holes 44 (FIG. 2) in an interior shoulder of the ring insert. Depending on the design of the ring insert and/or the prober head stage, it may be necessary to fit an adapter between the ring insert and the prober head stage.

Figure 2:
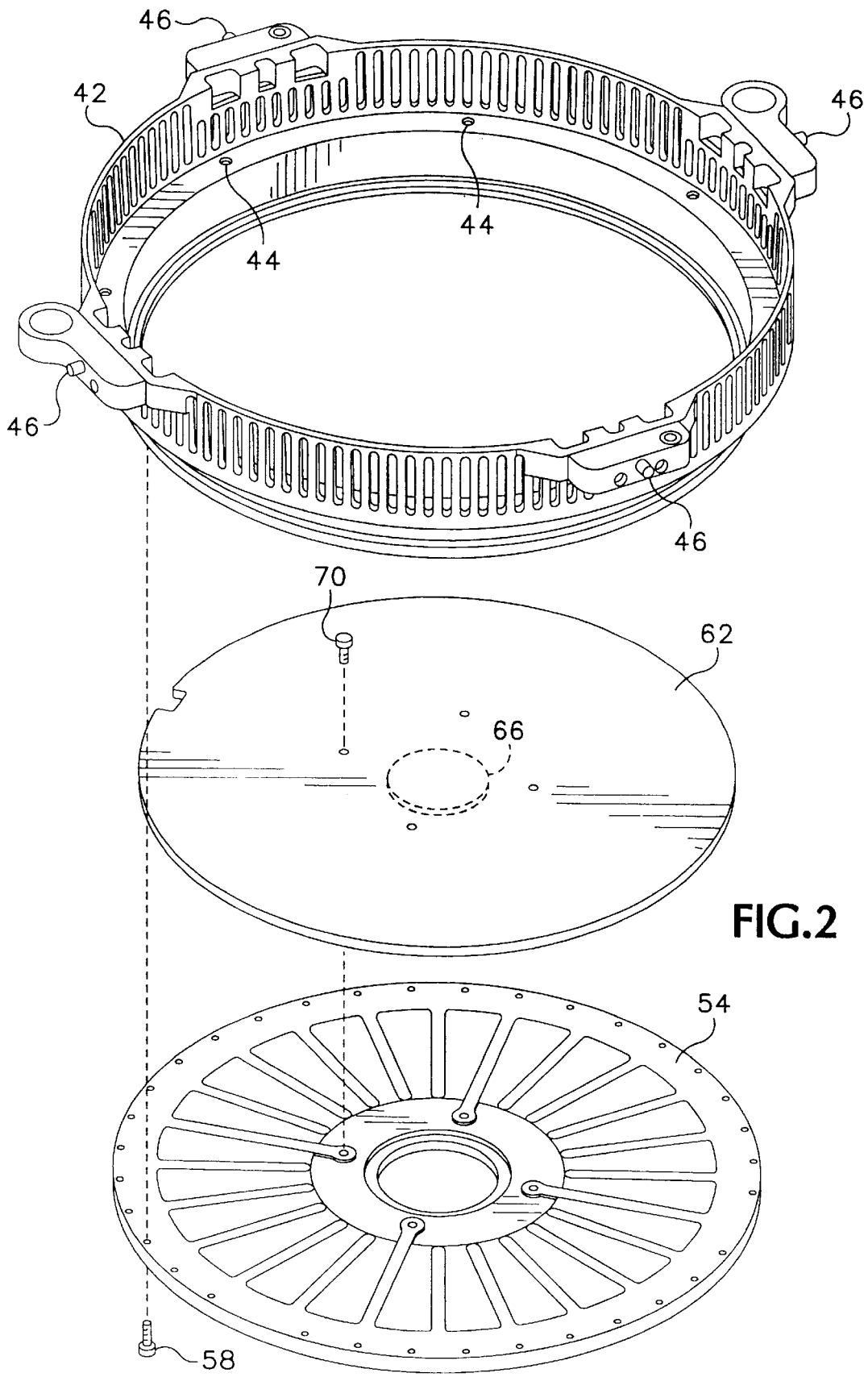
FIG. 2 is an exploded view of the ring insert assembly shown in FIG. 1.

The ring insert has attachment features for engaging complementary attachment features of a docking plate attached to the test head 50 (FIG. 1) of a semiconductor tester. In FIGS. 1 and 2 the attachment features of the ring insert are illustrated as cam follower pins 46 for engaging cams of the docking plate. For clarity, the cams and related structures of the docking plate are not shown in FIG. 1.

A thermal isolation plate 54 is positioned so that an upper surface of the thermal isolation plate is presented to the lower surface of the ring insert, and the thermal isolation plate is attached at its periphery to the ring insert by screws 58. The thermal isolation plate has a circular outer periphery and is formed with an opening which is illustrated in FIG. 2 as being circular.

A probe card 62 includes a ceramic probe needle support ring 66 attached to its underside for supporting probe needles (not shown) which project downward from the probe card. The probe card is positioned above the thermal isolation plate with the probe needle support ring received in the opening in the thermal isolation plate, so that the probe needles extend down beyond the lower surface of the thermal isolation plate. The probe card is attached to the thermal isolation plate by screws 70 which engage the probe card near the probe needle support ring 66. The probe card is unconstrained at its periphery.

The thermal isolation plate is a composite structure, the major part of which is an aluminum substrate 74. Aluminum has a high coefficient of thermal conductivity and therefore the thermal isolation plate has a strong tendency to remain isothermal, i.e. hot spots do not develop in the isolation plate, causing localized warming of the probe card. Therefore, when the thermal isolation plate is heated by virtue of its proximity to the chuck 30, there are no objectionable thermal gradients in the substrate 74 and the substrate 74 has a substantially uniform temperature over its entire area. Consequently, any thermally induced strain of the probe card remains essentially constant with time, regardless of movement of the chuck.

The lower surface of the substrate 74 is provided with a metal plating 76. The plating 76 is highly polished so that the lower surface of the thermal isolation plate has a low absorptivity with respect to infra red radiation and accordingly heat radiated from the thermal chuck is efficiently reflected from the thermal isolation plate and is not readily absorbed by the plate. The plating 76 may be made of chromium. Since chromium does not adhere well to aluminum, to improve durability an adhesion layer of nickel may be deposited on the substrate before applying the chromium.

A white coating 78 of epoxy material is applied to the upper surface of the aluminum substrate 74 by powder coating. The upper surface of the thermal isolation plate therefore has a low emissivity with respect to infra red radiation and consequently does not radiate heat toward the probe card readily. Further, the white coating 78 has a low thermal conductivity. Thus, even though aluminum is a good conductor of heat, the thermal isolation plate serves as an efficient thermal barrier between the heated chuck and the probe card, thereby minimizing thermally induced strain in the probe card.

The upper surface of the thermal isolation plate is locally relieved in accordance with a predetermined pattern in order to accommodate electrical components mounted at the underside of the probe card and other elements projecting from the underside of the probe card, such as wires attached to the underside of the probe card and leads projecting through the probe card from its upper surface. The powder coating 78 is an efficient electrical insulator, so that if conductive elements exposed at the underside of the probe card should contact the thermal isolation plate, they will not be short circuited by the thermal isolation plate.

Since the probe card is attached to the thermal isolation plate in the vicinity of the probe needle support ring and is unconstrained at its periphery, thermally induced strain outside the probe needle support ring is accommodated without significantly displacing the probe needles.

Being composed mainly of aluminum, the thermal isolation plate 54 is stiff and resists bending of the probe card under forces applied by the pogo pins when the test head is docked to the ring insert.

FIG. 4 shows a modified form of thermal isolation plate. In FIG. 4, the thermal isolation plate 54' has an external flange which is offset upwardly from the inner region of the plate. This provides greater space between the probe card 62 and the docking plate of the test head and positions the probe needles closer to the path of movement of the translation stage 34.

It will be appreciated that the invention is not restricted to the particular embodiment that has been described, and that variations may be made therein without departing from the scope of the invention as defined in the appended claims and equivalents thereof. For example, although the invention has been described in connection with a wafer prober of the kind in which the probe card is changed by undocking the test head from the ring insert and removing the probe card, the invention is also applicable to a prober having a bottom probe card changer. Also, the invention is not restricted to the thermally conductive plate having the specified surface coatings, since even without the surface coatings, the thermally conductive plate provides a good degree of thermal isolation between the probe card and the thermal chuck. Moreover, although aluminum is the preferred metal for the thermal isolation plate, the invention is not restricted to use of aluminum and other metals having good thermal conductivity may be used instead, it being understood that a metal of which the thermal conductivity is at least about 90% that of aluminum has "good" thermal conductivity.

What is claimed is:

1. An article of manufacture comprising a stiff, generally annular plate made of a metal having good thermal conductivity and having first and second opposite surfaces, the first surface having a low emissivity and the second surface having a low absorptivity.

2. An article according to claim 1, wherein the surface of low absorptivity is a highly polished surface.

3. An article according to claim 2, wherein the plate comprises a substrate of aluminum and a coating of chromium at said second surface.

4. An article according to claim 1, wherein the surface of low emissivity is a white surface.

5. An article according to claim 4, wherein the plate comprises a substrate of aluminum and a coating of synthetic polymer material at said first surface.

6. An article according to claim 5, wherein the coating is a white epoxy material.

7. An article according to claim 1, wherein the plate comprises a substrate of aluminum and a coating at said first surface, said coating being formed of a material having a low thermal conductivity.

8. A ring insert assembly for interfacing a wafer prober to a test head, including:
    a ring insert for attachment to the wafer prober and for docking to the test head,
    a thermal isolation plate attached to the ring insert and having a first surface oriented toward the ring insert and a second, opposite surface oriented away from the ring insert, the thermal isolation plate being made of a metal having good thermal conductivity, and
    a probe card attached to the thermal isolation plate in confronting relationship with the first surface of the thermal isolation plate.

9. A ring insert assembly according to claim 8, wherein the probe card has an outer peripheral region and an inner region at which the probe card includes probe elements for engaging a device under test, and the probe card is attached to the thermal isolation plate at locations that are substantially closer to the inner region than to the outer peripheral region.

10. A ring insert assembly according to claim 9, wherein the probe card is substantially unconstrained at its outer peripheral region.

11. A ring insert assembly according to claim 9, wherein the probe card includes a support member for supporting the probe elements, and wherein the probe card is attached to the thermal isolation plate at locations close to the support member.

12. A ring insert assembly according to claim 8, wherein the thermal isolation plate comprises a substrate of aluminum and a coating at said first surface, said coating being formed of a material having a low thermal conductivity.

13. A ring insert assembly, for interfacing a wafer prober to a test head, including:
    a ring insert for attachment to the wafer prober and for docking to the test head,
    a thermal isolation plate attached to the ring insert and having a first surface oriented toward the ring insert and a second, opposite surface oriented away from the ring insert, and
    a probe card attached to the thermal isolation plate in confronting relationship with the first surface of the thermal isolation plate,
    and wherein the first surface of the thermal isolation plate has a low emissivity and the second surface of the thermal isolation plate has a low absorptivity.

14. A ring insert assembly according to claim 13, wherein the first surface is a white surface.

15. A ring insert assembly according to claim 14, wherein the thermal isolation plate comprises a substrate of aluminum and a coating of synthetic polymer material at said first surface.

16. A ring insert assembly according to claim 15, wherein the synthetic polymer material is a white epoxy material.

17. A ring insert assembly according to claim 13, wherein the second surface is a highly polished surface.

18. A ring insert assembly according to claim 17, wherein the plate comprises a substrate of aluminum and a coating of chromium at said second surface.

* * * * *